United States Patent
Yeom (10) Patent No.: US 7,916,198 B2
(45) Date of Patent: Mar. 29, 2011

(54) COMMON MODE FEEDBACK CIRCUIT SUPPORTING DUAL DATA RATE, PROGRAMMABLE GAIN AMPLIFIER HAVING THE SAME, AND IMAGE SENSOR HAVING THE PROGRAMMABLE GAIN AMPLIFIER

(75) Inventor: Hyun Soo Yeom, Seongnam-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 352 days.

(21) Appl. No.: 12/182,824

(22) Filed: Jul. 30, 2008

(65) Prior Publication Data
US 2009/0167437 A1 Jul. 2, 2009

(30) Foreign Application Priority Data
Dec. 29, 2007 (KR) .................. 10-2007-0141099

(51) Int. Cl.
*H04N 5/335* (2006.01)
(52) U.S. Cl. ........................................ 348/308
(58) Field of Classification Search .......... 348/25, 348/229.1; 330/258–278; 327/337
See application file for complete search history.

(56) References Cited

U.S. PATENT DOCUMENTS

| 7,692,471 | B2* | 4/2010 | Uno | 327/337 |
| 2009/0027524 | A1* | 1/2009 | Cho | 348/255 |
| 2009/0058526 | A1* | 3/2009 | Hunter et al. | 330/258 |

FOREIGN PATENT DOCUMENTS

| JP | 2006-074084 | 3/2006 |
| KR | 1020010111176 A | 12/2001 |
| KR | 1020020063733 A | 8/2002 |

* cited by examiner

*Primary Examiner* — Tuan Ho
(74) *Attorney, Agent, or Firm* — F. Chau & Associates, LLC (57) ABSTRACT

A common mode feedback circuit includes a first capacitor connected between a common mode feedback terminal and a first output terminal, a second capacitor connected between the common mode feedback terminal and a second output terminal, a first cell having a third capacitor sharing charges with the first capacitor and a fourth capacitor sharing charges with the second capacitor in response to a first clock control signal, and a second cell having a fifth capacitor sharing charges with the first capacitor and a sixth capacitor sharing charges with the second capacitor in response to a second clock control signal. The first clock control signal and the second clock control signal have respective logic states that do not overlap in time.

12 Claims, 12 Drawing Sheets

FIG. 11

COMMON MODE FEEDBACK CIRCUIT SUPPORTING DUAL DATA RATE, PROGRAMMABLE GAIN AMPLIFIER HAVING THE SAME, AND IMAGE SENSOR HAVING THE PROGRAMMABLE GAIN AMPLIFIER

PRIORITY STATEMENT

This application claims priority under 35 U.S.C. §119 to Korean Patent Application No. 10-2007-0141099, filed on Dec. 29, 2007, in the Korean Intellectual Property Office, the entire contents of which is incorporated herein by reference.

BACKGROUND

1. Technical Field

The present disclosure relates to a common mode feedback (CMFB) circuit and, more particularly, to a CMFB circuit supporting a dual data rate (DDR) by removing an offset occurring between buses, a programmable gain amplifier (PGA) having the CMFB circuit, and an image sensor having the PGA.

2. Discussion of Related Art

A typical example of an analog integrated circuit is an operational amplifier. Ideally, the operational amplifier has characteristics of infinite gain, infinite input impedance, and zero output impedance. The characteristics of an actual operational amplifier, however, are different from those of an ideal operational amplifier.

For example, in a fully differential amplifier, when a plurality of biases are all fixed without using the CMFB circuit, the range of an output signal of the fully differential amplifier is not secured or the gain is lowered due to a change in power, temperature, or manufacturing process, a change between an input common mode and an output common mode of the fully differential amplifier, or a change in the output common mode caused by noise.

That is, when there is no difference between input signals at a single-ended amplifier, the output of the single-ended amplifier is positioned in the middle of an overall voltage swing range. When the fully differential amplifier has no CMFB circuit, the output of the fully differential amplifier is biased to a level that is not at a middle level between the signals, so that the operation of the fully differential amplifier is restricted.

The CMFB circuit is a negative feedback circuit that detects a common mode voltage of an operational amplifier, compares a reference voltage charged during a reset period with the detected common mode voltage, and drives the detected common mode voltage to be close to the reference voltage, according to a result of the comparison. More specifically, the CMFB circuit is used at an output terminal for setting a common mode of differential output voltages, so that the low-voltage and low-power operations of the operational amplifier are facilitated.

Figure 1:
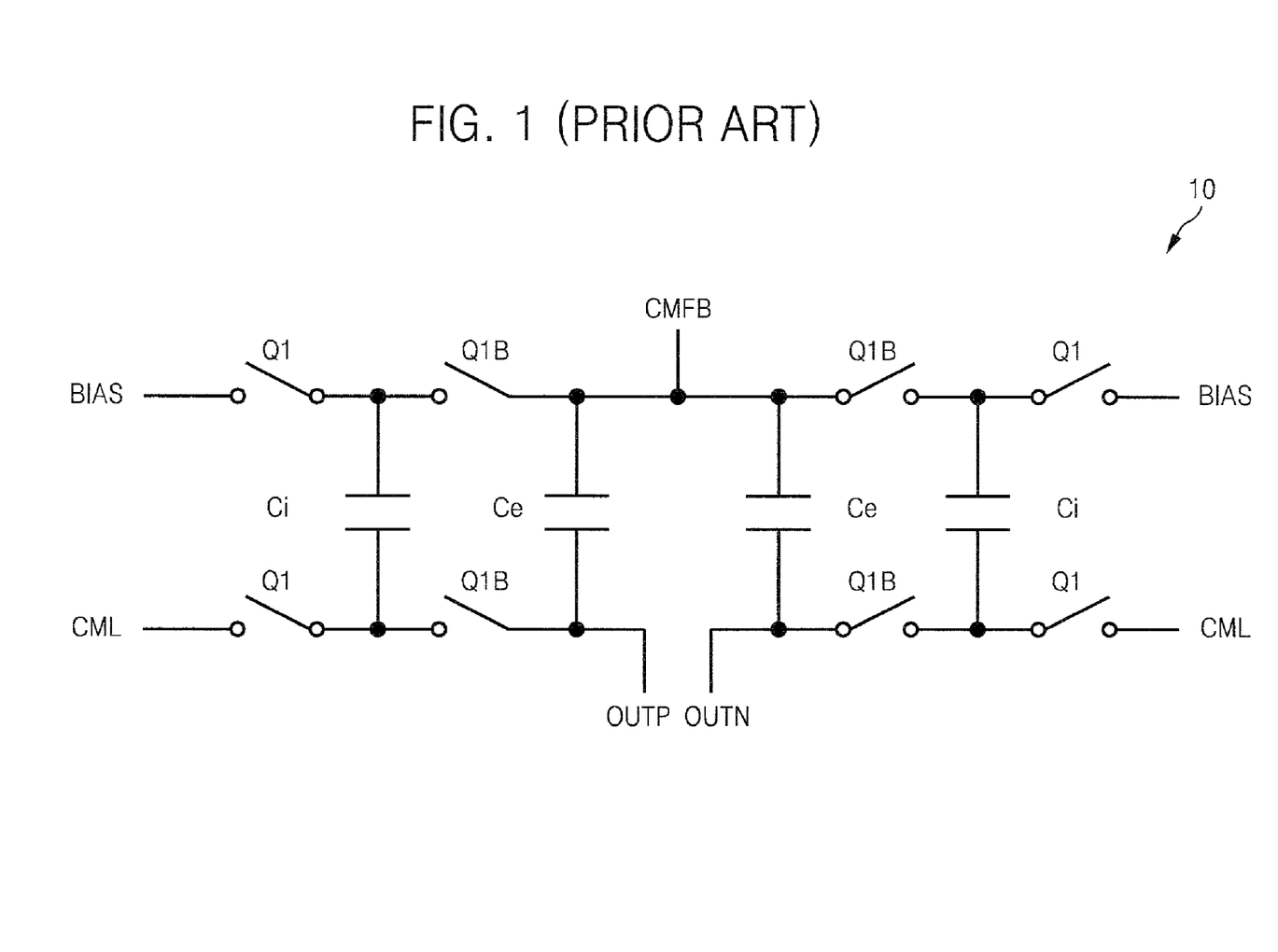
FIG. 1 is a circuit diagram of a conventional CMFB circuit.

FIG. 1 is a circuit diagram of a conventional CMFB circuit. Referring to FIG. 1, a CMFB circuit 10 includes four capacitors Ce and Ci to forcibly hold a common voltage of output terminals OUTP and OUTN of an operational amplifier and to effectively hold the common voltage at a low voltage, so as to operate as a dynamic CMFB circuit. When the throughput of the data is to be increased by quickly processing the data using a PGA, including the CMFB circuit 10 and an analog-to-digital converter (ADC), one method is to increase the frequency of a system clock signal.

Because there is a structural limit in this method, however, a dual data rate (DDR) structure is used to solve the problem, in which data is output at both a logic high (or rising edge) and a logic low (or falling edge) of the system clock signal.

In a general single data rate (SDR) structure, data of an amplifier is evaluated in a logic high (or rising edge) section of a system clock signal and the amplifier is reset in a logic low (or falling edge) section thereof. A DDR structure does not reset the amplifier to evaluate the data, even in the logic low section, that is, it does not have a reset section.

Figure 2A:
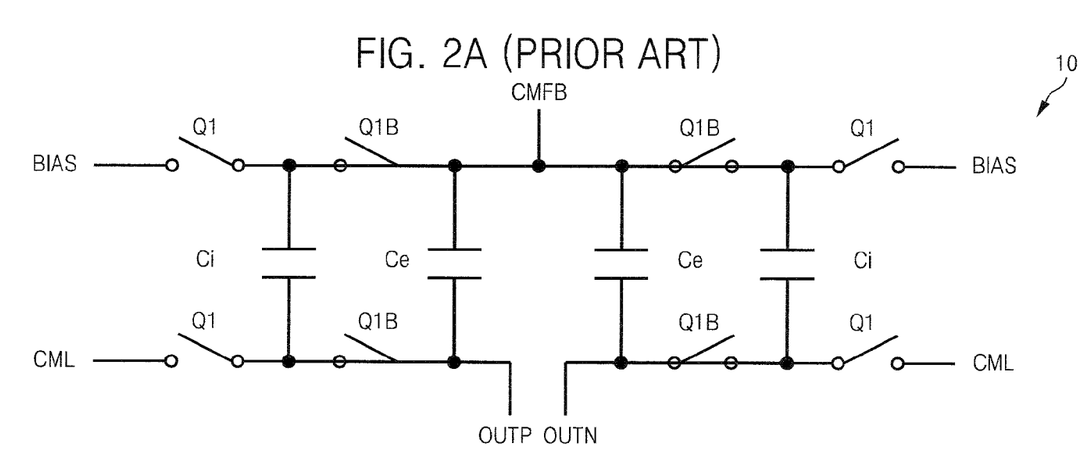
FIGS. 2A and 2B are circuit diagrams for explaining the operation of the conventional CMFB circuit of FIG. 1.
Figure 2B:
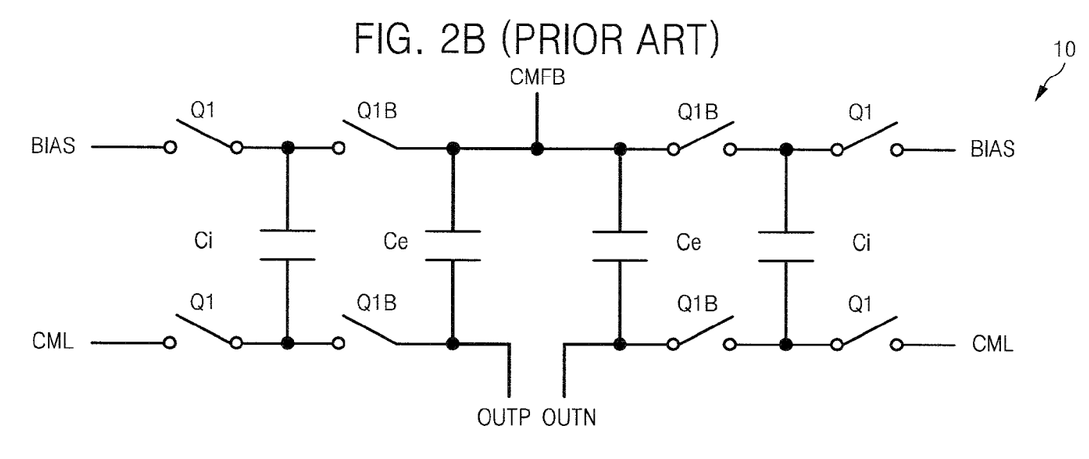
Figures 3A, 3B:
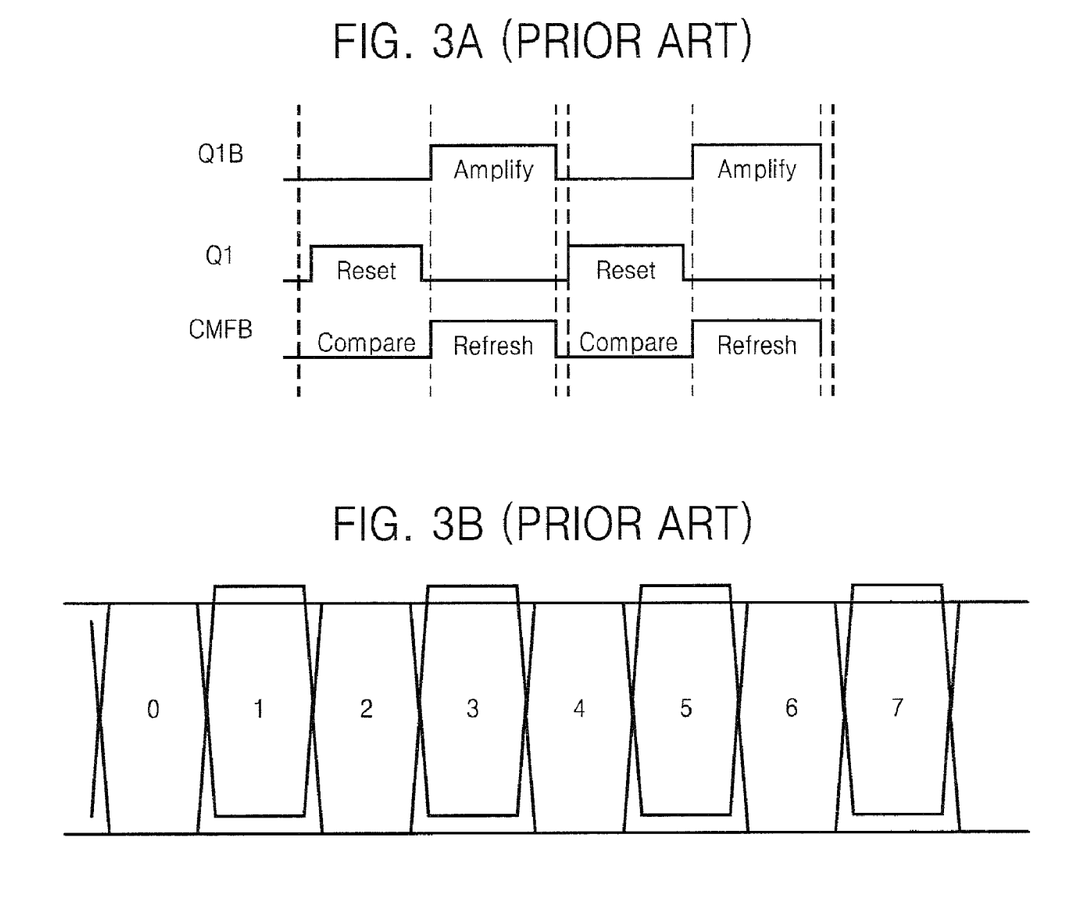
FIG. 3A is a timing diagram of an SDR method and FIG. 3B illustrates an offset occurring in a conventional DDR method.

FIGS. 2A and 2B show the operation of the CMFB circuit of FIG. 1. FIGS. 3A and 3B show the timing diagram in an SDR method and an offset occurring in a conventional DDR method, respectively.

Referring to FIG. 3A, the CMFB circuit compares the output of an operational amplifier (not shown) with a reference voltage in a section of "Reset" of the operational amplifier and refreshes a capacitor Ci with a bias voltage BIAS and a common mode signal line (CML) voltage in a section of "Amplify" of the operation amplifier. For a DDR method, the CMFB circuit 10 is operated as shown in FIGS. 2A and 2B.

Referring to FIG. 2A, when a switching signal Q1B is in a "logic high" state, a pair of capacitors Ci and Ce at each of the left and right sides share charges and generate a CMFB voltage Vcmfb. The CMFB voltage Vcmfb can be expressed by Equation 1.

$$Vcmfb = [\{Ci/(Ci+Ce)\} \times (BIAS - Vcmfb) + \{Ci/(Ci+Ce)\} \times (BIAS - Vcmfb)]/2 \quad [\text{Equation 1}]$$

In an SDR circuit of a general structure, that is, in practicing the method represented in FIG. 3A, when a switching signal Q1 is in a "logic high" state, the operational amplifier is reset, so that valid data is not output from the output terminal of the operational amplifier. On the other hand, in a DDR method, when the switching signal Q1 is in a "logic high" state, the operational amplifier must output valid data, as shown in FIG. 3A.

In this case, however, a capacitance value measured at the output terminal of the operational amplifier varies so that the gain varies accordingly, compared to the case when the switching signal Q1B is in a "logic high" state. Thus, the output of the CMFB circuit 10 varies in the "logic high" section of each of the switching signals Q1 and Q1B so that offset occurs.

As a result, when the CMFB circuit 10 as shown in FIG. 1 is used in a fully differential amplifier used for the DDR structure, the gain of the CMFB circuit varies in the section of "logic high" of each of the switching signals Q1 and Q1B. Accordingly, offset occurs, as shown in FIG. 3B.

SUMMARY OF THE INVENTION

Exemplary embodiments of the present invention provide a CMFB circuit that can remove an offset occurring due to a difference in the gain of the CMFB circuit between buses when a DDR scheme is implemented, and a method of removing an offset of the CMFB circuit.

Also, exemplary embodiments of the present invention provide a programmable gain amplifier having an improved operational speed that supports the DDR method by removing an offset between buses occurring due to the gain difference of the CMFB circuit.

Also, exemplary embodiments of the present invention provide an image sensor including the programmable gain amplifier.

According to an exemplary embodiment of the present invention, a common mode feedback circuit comprises a first capacitor connected between a common mode feedback terminal and a first output terminal, a second capacitor connected between the common mode feedback terminal and a second output terminal, a first cell having a third capacitor sharing charges with the first capacitor and a fourth capacitor sharing charges with the second capacitor in response to a first clock control signal, and a second cell having a fifth capacitor sharing charges with the first capacitor and a sixth capacitor sharing charges with the second capacitor in response to a second clock control signal. The first clock control signal and the second clock control signal are non-overlap signals, that is, their respective logic high periods do not overlap in time.

The first cell comprises a first switch supplying a bias voltage to a node to which an end of the third capacitor and an end of the fourth capacitor are connected, in response to the second clock control signal, a second switch switching between the node and the common mode feedback terminal to which an end of the first capacitor is connected, in response to the first clock control signal, a third switch switching between a common mode signal line and the other end of the fourth capacitor, in response to the second clock control signal, a fourth switch switching between the other end of the third capacitor and the first output terminal, in response to the first clock control signal, a fifth switch switching between the other end of the third capacitor and the common mode signal line, in response to the second clock control signal, and a sixth switch switching between the other end of the fourth capacitor and the second output terminal, in response to the first clock control signal.

The first cell further comprises a seventh capacitor connected between the other end of the third capacitor and the other end of the fourth capacitor.

The second cell comprises a seventh switch switching between the common mode feedback terminal to which an end of the second capacitor is connected and a node to which an end of the fifth capacitor and an end of the sixth capacitor are connected, in response to the second clock control signal, an eighth switch supplying a bias voltage to the node, in response to the first clock control signal, a ninth switch switching between the other end of the sixth capacitor and the other end of the second capacitor to which the second output terminal is connected, in response to the second clock control signal, a tenth switch switching between the common mode signal line and the other end of the fifth capacitor, in response to the first clock control signal, an eleventh switch switching between the other end of the sixth capacitor and the common mode signal line, in response to the first clock control signal, and a twelfth switch switching between the other end of the fifth capacitor and the first output terminal, in response to the second clock control signal.

The second cell further comprises an eighth capacitor connected between the other end of the fifth capacitor and the other end of the sixth capacitor.

According to an exemplary embodiment of the present invention, a programmable gain amplifier comprises a differential input unit, a gain stage connected to the differential input unit, and a common mode feedback circuit connected to the gain stage.

The common mode feedback circuit comprises a first capacitor connected between a common mode feedback terminal and a first output terminal, a second capacitor connected between the common mode feedback terminal and a second output terminal, a first cell, and a second cell. The first cell has a third capacitor sharing charges with the first capacitor and a fourth capacitor sharing charges with the second capacitor, in response to a first clock control signal. The second cell has a fifth capacitor sharing charges with the first capacitor and a sixth capacitor sharing charges with the second capacitor, in response to a second clock control signal.

The first clock control signal and the second clock control signal are non-overlap signals and data are output in a first logic state of each of the first clock control signal and the second clock signal.

The gain stage comprises a current mirror and a current source.

According to an exemplary embodiment of the present invention, an image sensor comprises a pixel array arrayed in a predetermined color pattern, a programmable gain amplifier comprising a differential input unit, a gain stage connected to the differential input unit, and a common mode feedback circuit connected to the gain stage, and an analog-to-digital converter converting an amplified analog signal to a digital signal.

BRIEF DESCRIPTION OF THE DRAWINGS

Exemplary embodiments of the present invention will be understood in more detail from the following descriptions taken in conjunction with the accompanying drawings.

DETAILED DESCRIPTION OF EXEMPLARY EMBODIMENTS

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 4:
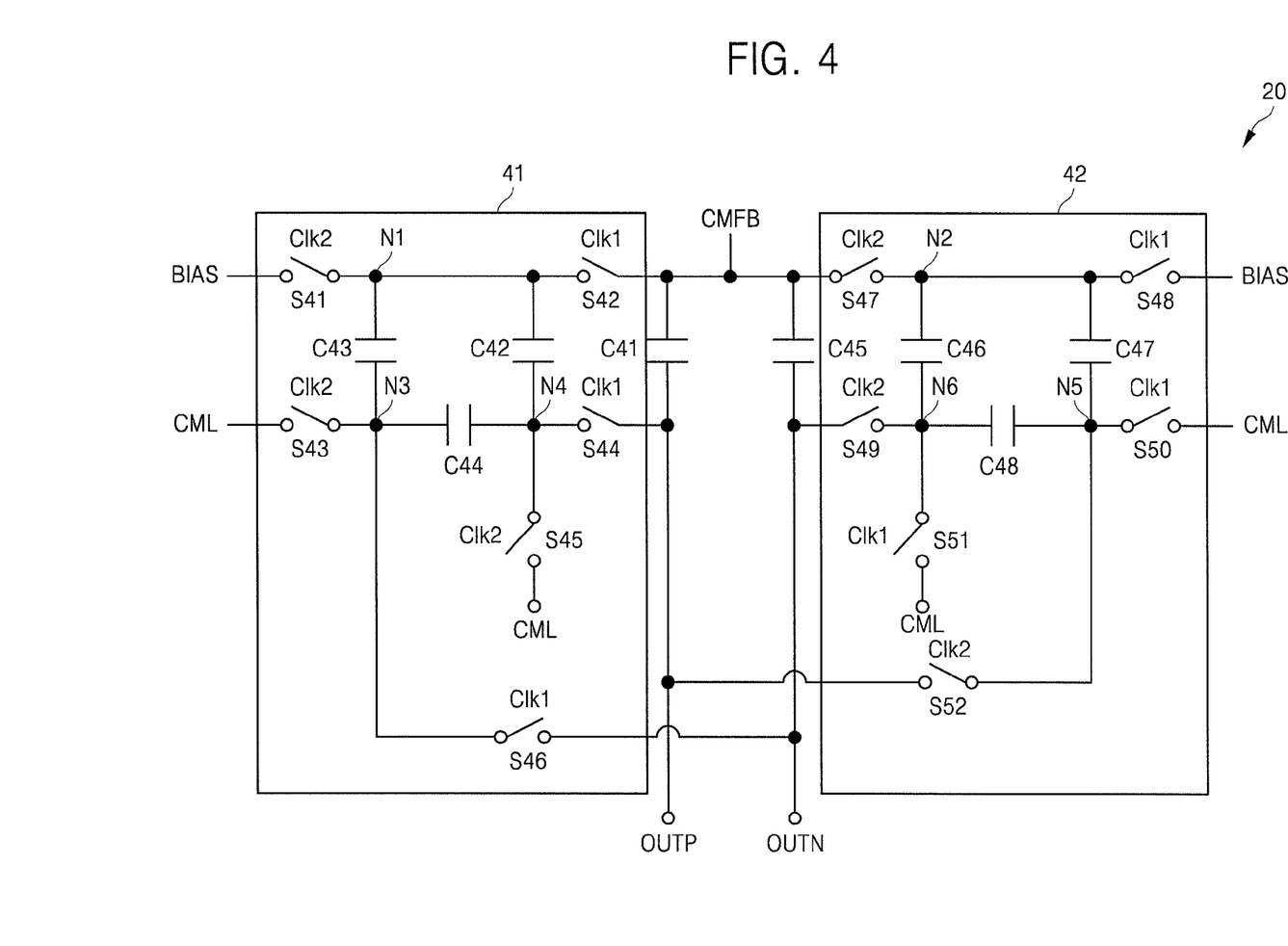
FIG. 4 is a circuit diagram of a CMFB circuit according to an exemplary embodiment of the present invention.

FIG. 4 is a circuit diagram of a common mode feedback (CMFB) circuit 20 according to an exemplary embodiment of the present invention. Referring to FIG. 4, the CMFB circuit 20 according to the present exemplary embodiment includes a first capacitor C41 connected between a CMFB terminal and a first output terminal OUTP, a second capacitor C45 connected between the CMFB terminal and a second output terminal OUTN, a first cell 41, and a second cell 42.

The first cell 41 includes a third capacitor C42 sharing charges with the first capacitor C41 in response to a first clock control signal Clk1 and a fourth capacitor C43 sharing charges with the second capacitor C45 in response to the first clock control signal Clk1, and generates a CMFB voltage.

The second cell 42 includes a fifth capacitor C47 sharing charges with the first capacitor C41 in response to a second clock control signal Clk2 and a sixth capacitor C46 sharing charges with the second capacitor C45 in response to the second clock control signal Clk2, and generates a CMFB voltage. The first clock control signal Clk1 and the second clock control signal Clk2 are non-overlap signals.

More specifically, the first cell 41 includes a first switch S41 providing a bias voltage BIAS to a first node N1, to which the third and fourth capacitors C42 and C43 are connected, in response to the second clock control signal Clk2, a second switch S42 switching between the first node N1 and the CMFB terminal in response to the first clock control signal Clk1, a third switch S43 switching between a common mode signal line CML and a third node N3, to which the fourth capacitor C43 is connected, in response to the second clock control signal Clk2, the sixth switch S46 switching between the fourth capacitor C43 and the second output terminal OUTN in response to the first clock control signal Clk1, a seventh capacitor C44 connected between the third node N3 and the fourth node N4 to which the third capacitor C42 is connected, a fifth switch S45 switching between the common mode signal line CML and the fourth node N4 in response to the second clock control signal Clk2, and a fourth switch S44 switching between the third capacitor C42 and the first output terminal OUTP in response to the first clock control signal Clk1.

The second cell 42 includes an eighth switch S48 providing a bias voltage BIAS to a second node N2, to which the fifth and sixth capacitors C47 and C46 are connected, in response to the first clock control signal Clk1, a seventh switch S47 switching between the second node N2 and the CMFB terminal in response to the second clock control signal Clk2, a tenth switch S50 switching between a common mode signal line CML and the fifth capacitor C47 in response to the first clock control signal Clk1, a twelfth switch S52 switching between a fifth node N5 to which the fifth capacitor C47 is connected and the first output terminal OUTP in response to the second clock control signal Clk2, an eighth capacitor C48 connected between the fifth node N5 and a sixth node N6 to which the sixth capacitor C46 is connected, an eleventh switch S51 switching between the sixth capacitor C46 and the common mode signal line CML in response to the first clock control signal Clk1, and a ninth switch S49 switching between the sixth capacitor C46 and the second output terminal OUTN in response to the second clock control signal Clk2.

Figure 5A:
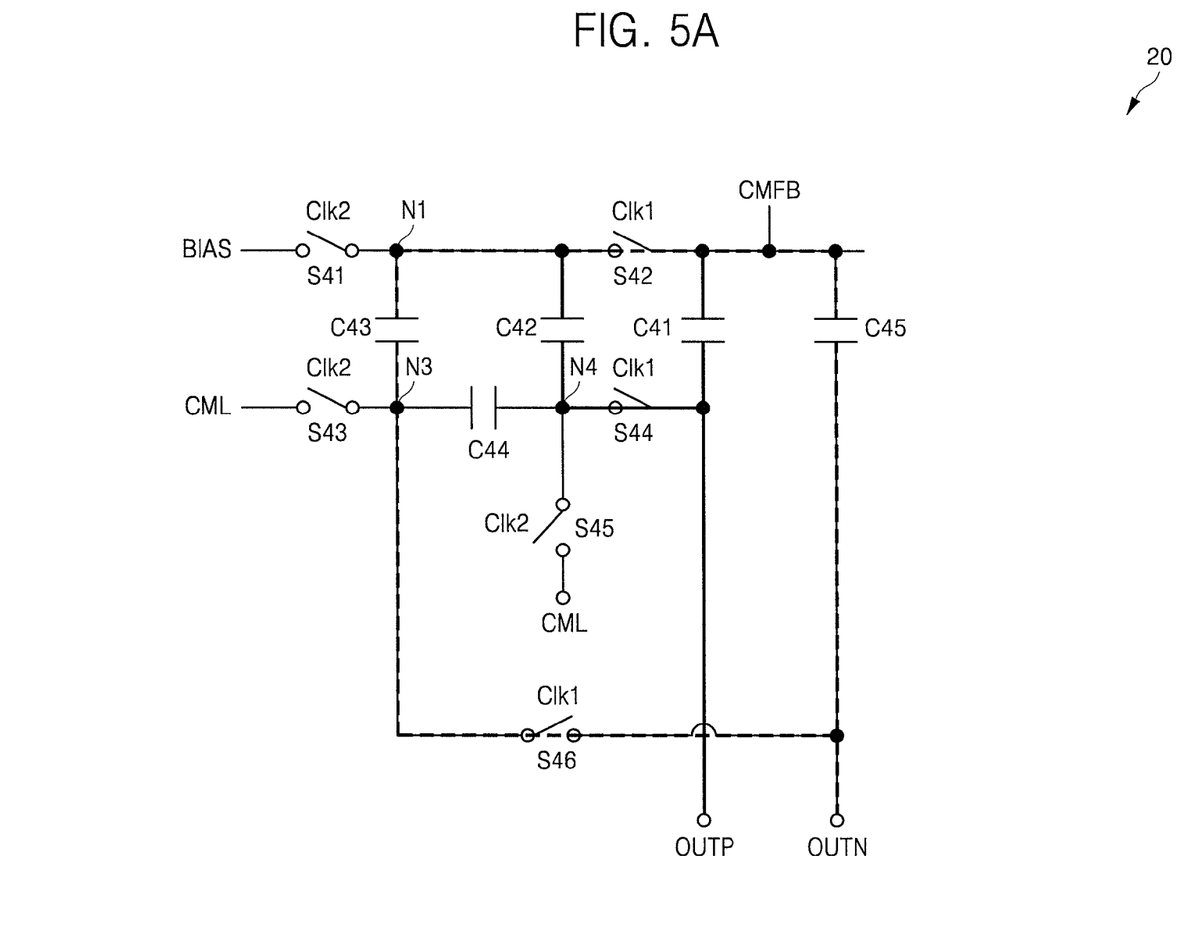
FIGS. 5A and 5B are circuit diagrams for explaining the operation of the CMFB circuit of FIG. 4.
Figure 5B:
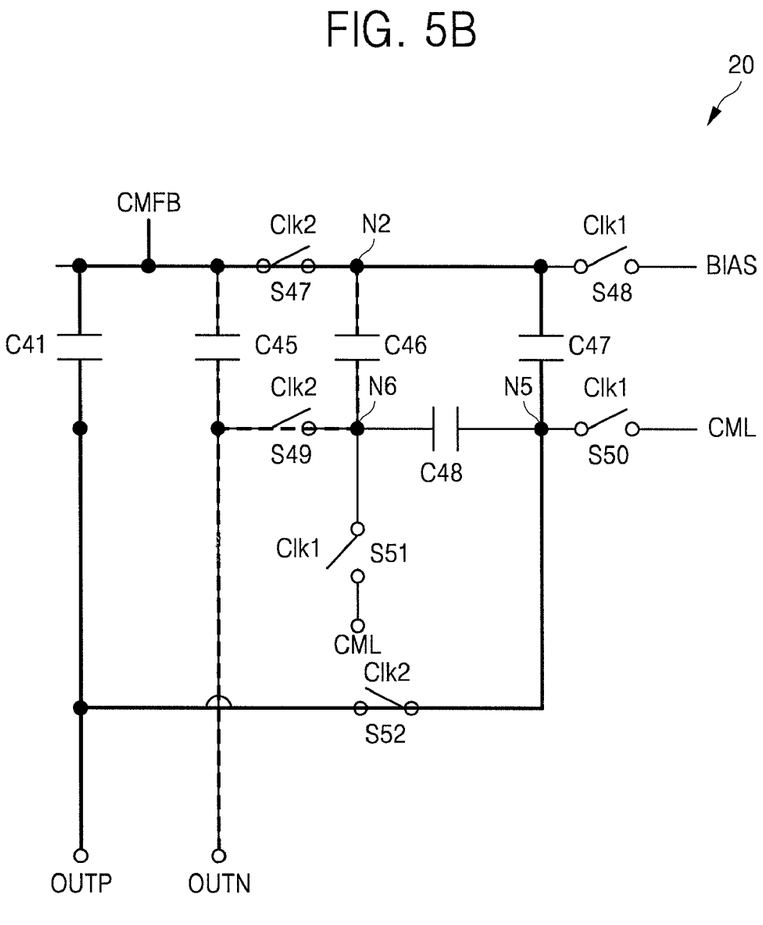
Figure 6:
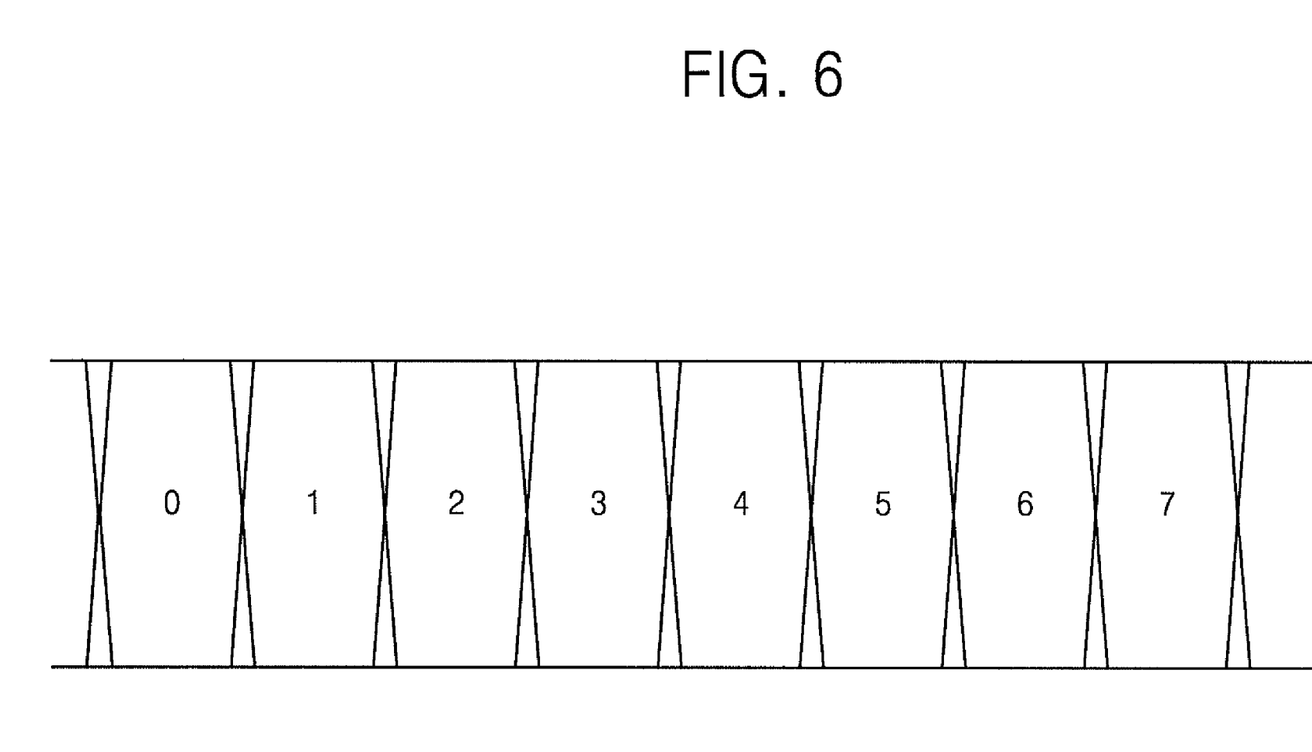
FIG. 6 illustrates that the offset between buses is removed by the CMFB circuit of FIG. 4.

FIGS. 5A and 5B are circuit diagrams for explaining the operation of the CMFB circuit 20 of FIG. 4. FIG. 6 illustrates that the offset between buses is removed by the CMFB circuit 20 of FIG. 4. In the operation of the CMFB circuit 20 according to the present exemplary embodiment, referring to FIG. 5A, when the first clock control signal Clk1 is in a "logic high" state, the first and third capacitors C41 and C42 share charges and the second and fourth capacitors C45 and C43 share charges, thereby generating a CMFB voltage Vcmfb. The CMFB voltage Vcmfb can be expressed by Equation 2.

$$Vcmfb=[\{C42/(C41+C42)\}\times(BIAS-Vcmfb)+\{C43/(C43+C45)\}\times(BIAS-Vcmfb)]/2 \qquad \text{[Equation 2]}$$

Referring to FIG. 5B, when the second clock control signal Clk2 is in a "logic high" state, the second and sixth capacitors C45 and C46 share charges and the first and fifth capacitors C41 and C47 share charges, thereby generating a CMFB voltage Vcmfb. The CMFB voltage Vcmfb can be expressed by Equation 3.

$$Vcmfb=[\{C46/(C45+C46)\}\times(BIAS-Vcmfb)+\{C47/(C41+C47)\}\times(BIAS-Vcmfb)]/2 \qquad \text{[Equation 3]}$$

As described above, in the present exemplary embodiment, the gain of the CMFB in each of the "logic high" section of the first clock control signal Clk1 and the "logic high" section of the second clock control signal Clk2 must be identical. Thus, CMFB voltage Vcmfb is generated by sharing charges of the capacitors in the "logic high" section of each of the first clock control signal Clk1 and the second clock control signal CLk2. CMFB circuit 20 can obtain a desired common mode output of an operational amplifier by changing the CMFB voltage Vcmfb until the BIAS voltage reaches the CMFB voltage. Referring to FIG. 6, it can be seen that the offset between buses, which existed in the prior art as shown in FIG. 3B, is removed.

Figure 7:
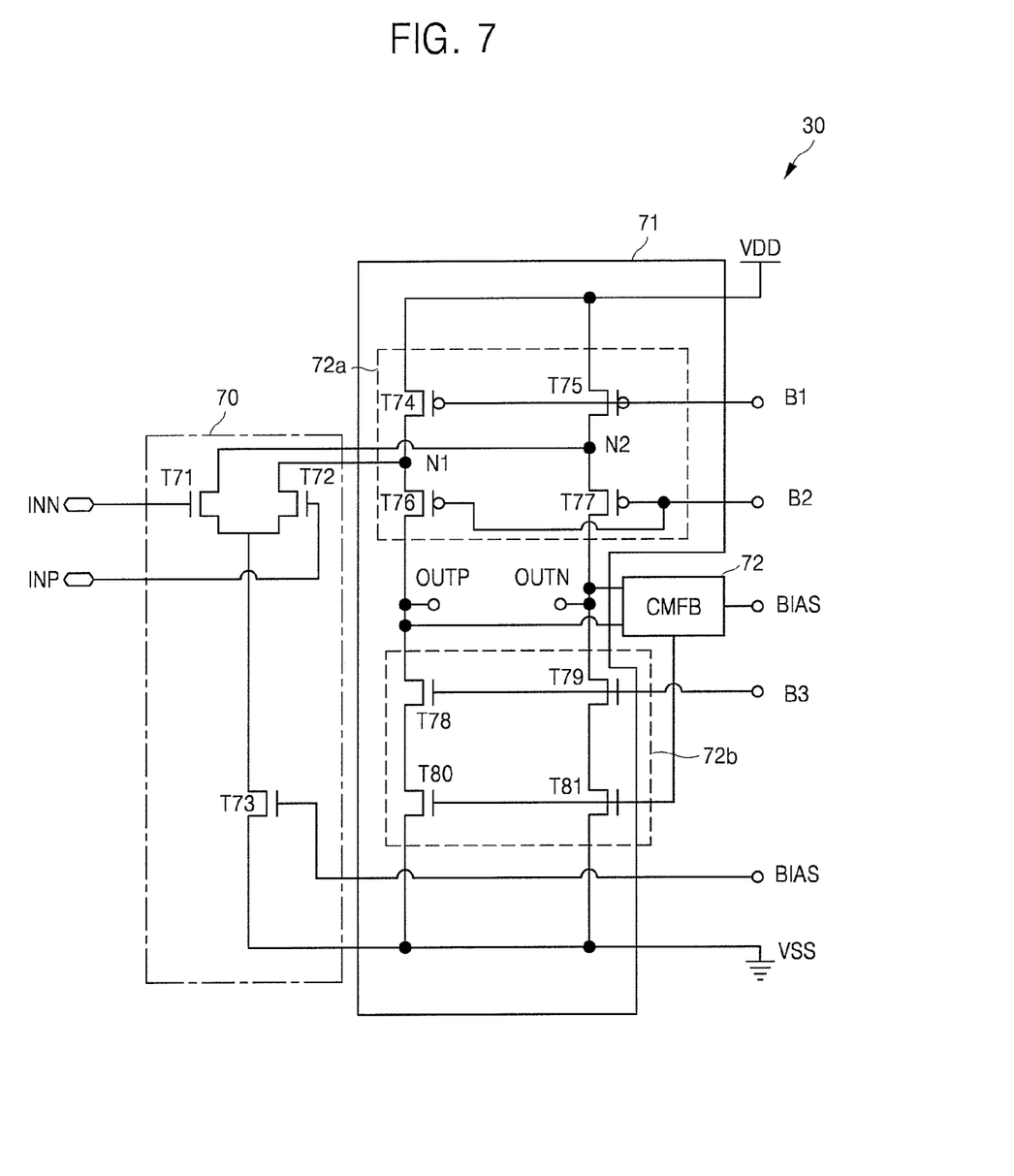
FIG. 7 is a circuit diagram of a folded cascade operational amplifier that is an example of a programmable gain amplifier including the CMFB circuit of FIG. 4.

FIG. 7 is a circuit diagram of a folded cascade operational amplifier that is an exemplary embodiment of a programmable gain amplifier including the CMFB circuit of FIG. 4. Referring to FIG. 7, the folded cascade operational amplifier 30 includes a differential input unit 70 including a plurality of transistors T71, T72, and T73, a folded cascade gain stage 71, and a CMFB unit 72. The folded cascade gain stage 71 includes a cascade current mirror 72a including a plurality of transistors T74, T75, T76, and T77 and a cascade current source 72b including a plurality of transistors T78, T79, T80, and T81.

Figure 8A:
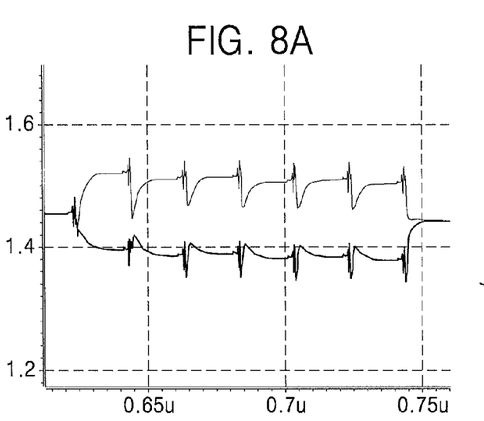
FIGS. 8A, 8B, and 8C are timing diagrams for explaining the operational characteristics of the programmable gain amplifier of FIG. 7.
Figure 8B:
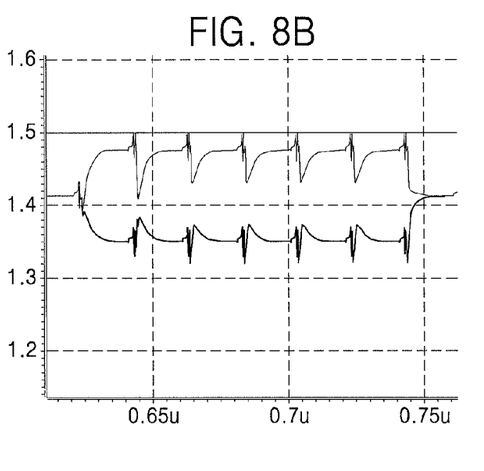
Figure 8C:
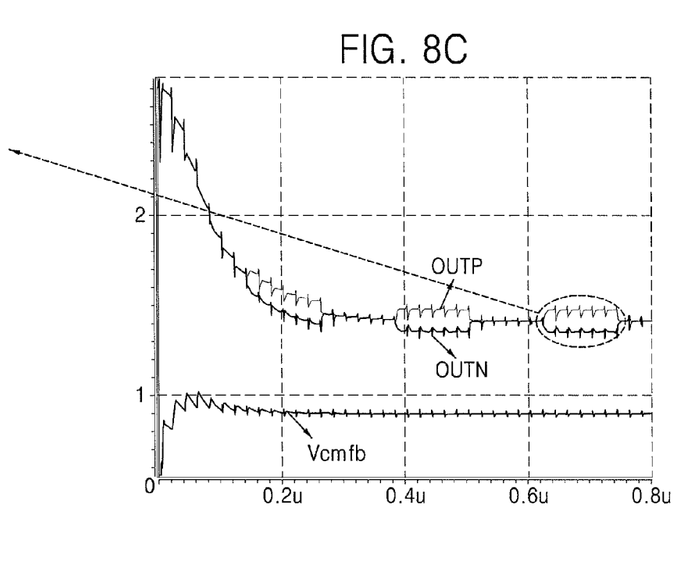

FIGS. 8A, 8B, and 8C are timing diagrams for explaining the operational characteristics of the programmable gain amplifier 30 shown in FIG. 7. Referring to FIG. 8A, as a result of a simulation using a signal of 1000 mV according to the conventional method, an offset of 3.1 mV occurs between two buses and accordingly an error of 3.2 codes is generated. In contrast, referring to FIG. 8B, at the same conditions the programmable gain amplifier 30 according to the present exemplary embodiment produces an offset of 0.024 mV between two buses, so that an error of 0.025 codes is generated.

As it can be seen from FIG. 8C, the offset occurring between two buses can be remarkably reduced compared to the prior art by applying the CMFB circuit 20 according to the present exemplary embodiment to the programmable gain amplifier 30.

Figure 9:
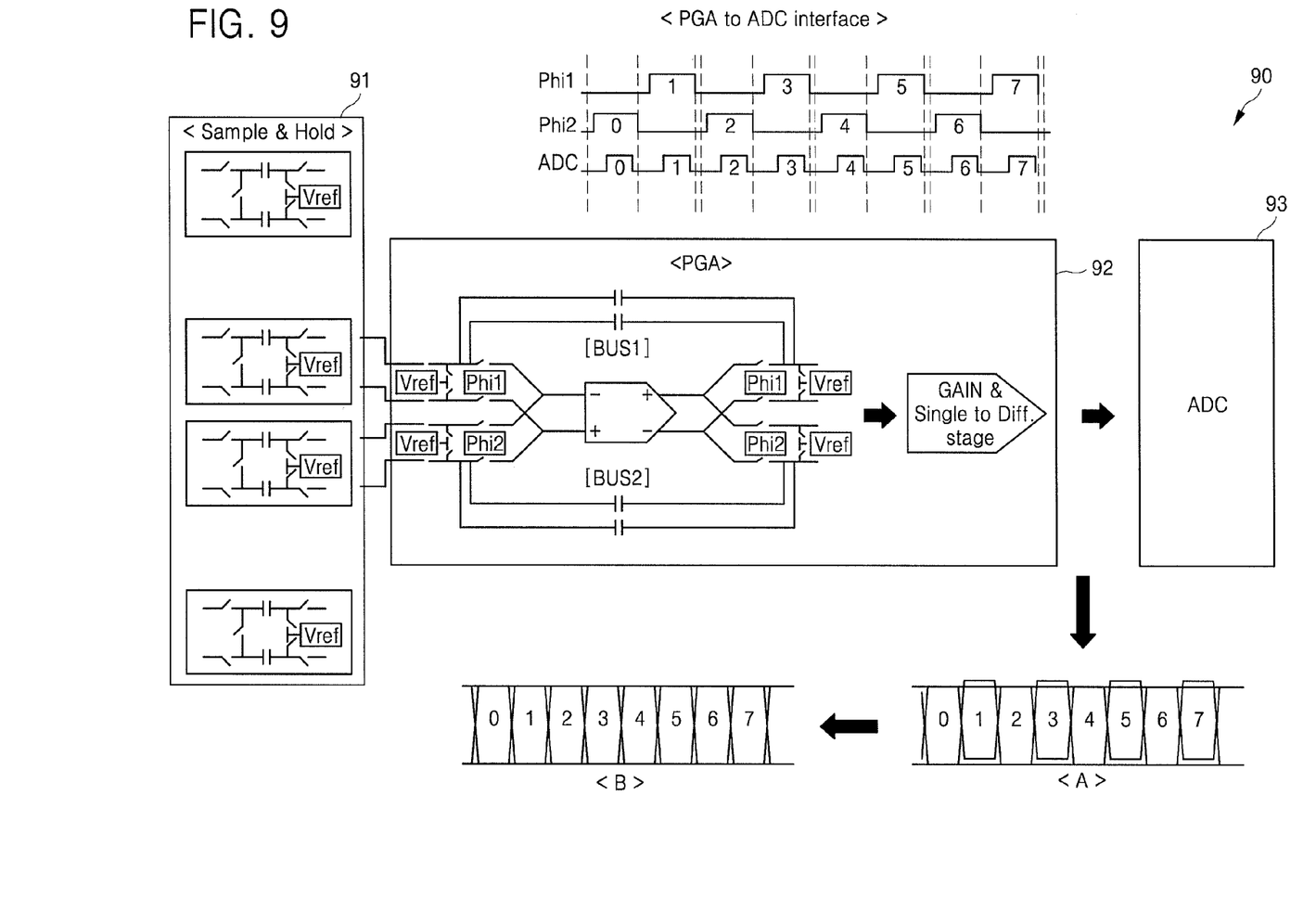
FIG. 9 is a block diagram schematically illustrating an example of the programmable gain amplifier of FIG. 7 applied to an analog integrated circuit.

FIG. 9 is a block diagram schematically illustrating an exemplary embodiment of the programmable gain amplifier 30 shown in FIG. 7 applied to an analog integrated circuit 90. Referring to FIG. 9, an analog signal provided through a sample and hold circuit 91 is input to a programmable gain amplifier (PGA) 92 and controlled by two control signals Phi1 and Phi2. The output of the programmable gain amplifier 92 is output as a digital signal to an analog-to-digital converter (ADC) 93.

In order to increase the throughput of the data by quickly processing the data using the ADC 93 and the programmable gain amplifier 92, there is a structural limit in the operation of the analog integrated circuit 90 that can be overcome only by increasing the frequency of a system clock, which is an unacceptable solution. Thus, to overcome the limit, a DDR scheme is used in which data are output in both of the "logic high" section and the "logic low" section of a master clock. Each of the control signals Phi1 and Phi2 is a signal generated using at least part of the master clock. The two buses are indicated as BUS1 and BUS2. It can be seen that the offset between the two buses is almost removed, from "A" to "B", by applying the CMFB of the present exemplary embodiment.

Figure 10:
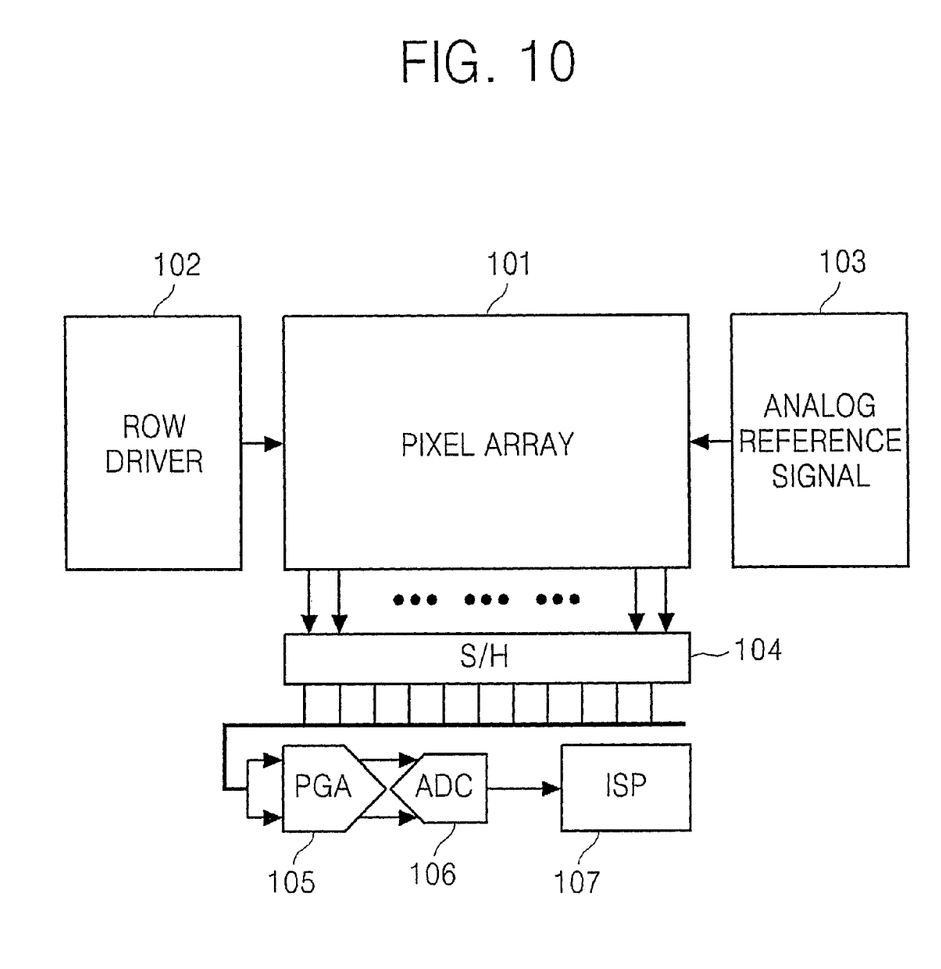
FIG. 10 is a block diagram of an image sensor using the programmable gain amplifier and the ADC of FIG. 9.

FIG. 10 is a block diagram of an image sensor using the programmable gain amplifier 92 and the ADC 93 shown in FIG. 9. The image sensor of FIG. 10 supports a correlated double sampling (CDS) operation. Referring to FIG. 10, the image sensor includes a pixel array 101 in which a plurality of pixels are arrayed in a predetermined pattern, a row driver 102 driving the row of the pixel array 101, an analog reference signal block 103 providing a reference of a dark level with respect to a pixel output signal, a sample and hold circuit (S/H) 104 temporarily storing a signal output from the pixel array 101, a programmable gain amplifier (PGA) 105 receiving reset and detection signals from the sample and hold circuit 104 and amplifying the received signals according to a variable gain, an ADC 106 converting an amplified analog signal to a digital signal, and an image signal processor (ISP) 107 performing gamma correction, color correction, or auto white balance.

Figure 11:
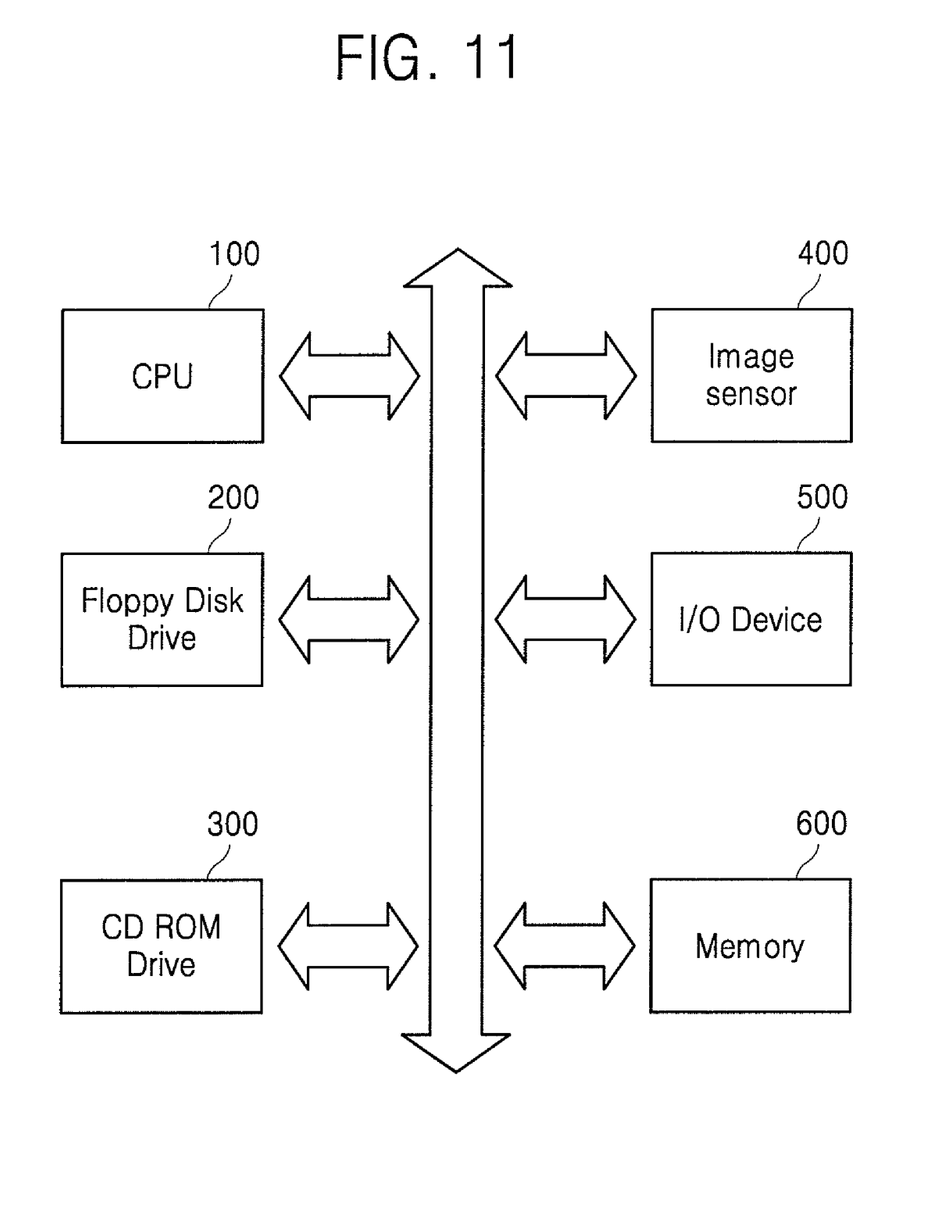
FIG. 11 illustrates a computer system including an image sensor according to an exemplary embodiment of the present invention.

Although it is not shown in FIG. 10, the digital signal output from the ADC 106 is stored in a latch array. Also, the pixel array 101 may use any color filter array, such as the Bayer color pattern of RGB and a combination of complementary colors such as yellow, magenta, and cyan, and white or black In additional, the signal input to the programmable gain amplifier 105 is a signal to which CDS is applied, that is, having a difference between a reset level and a detection level, or a signal which CDS is not applied, that is, the reset level and the detection signal level are sequentially input FIG. 11 illustrates a computer system including the image sensor of FIG. 10 according to an exemplary embodiment of the present invention. Referring to FIG. 11, the computer system according to the present exemplary embodiment exchanges data through a system bus and a local bus and includes a central processing unit (CPU) 100, a floppy disk drive 200, a CD-ROM drive 300, an image sensor 400, an input/output (I/O) device 500, and a memory 600.

Although not shown, the memory 600 may include a RAM that is a volatile memory, and a flash memory that is a nonvolatile memory, or a PRAM. The image sensor 400 may be used for a camera by being coupled to a camera body, a drive unit, and an external lens as modules of the camera.

As described above, when the CMFB of exemplary embodiments of the present invention is used for an operational amplifier supporting the DDR, the offset between the buses can be removed. Also, according to exemplary embodiments of the present invention, the performance of the programmable gain amplifier of a DDR scheme including the CMFB and the image sensor having the programmable gain amplifier can be improved. Furthermore, in exemplary embodiments of the present invention, because the generation of an offset due to the difference in gain of the CMFB between buses is prevented by using the DDR method, the performance of the CMFB is remarkably improved and, simultaneously, the performance of the PGA and the image sensor having the CMFB can be greatly improved.

While this invention has been particularly shown and described with reference to exemplary embodiments thereof, it will be understood by those of ordinary skill in the art that various changes in form and details may be made therein without departing from the spirit and scope of the invention, as defined by the appended claims.

What is claimed is:

1. A common mode feedback circuit comprising:
a first capacitor connected between a common mode feedback terminal and a first output terminal;
a second capacitor connected between the common mode feedback terminal and a second output terminal;
a first cell having a third capacitor sharing charges with the first capacitor and a fourth capacitor sharing charges with the second capacitor, in response to a first clock control signal; and
a second cell having a fifth capacitor sharing charges with the first capacitor and a sixth capacitor sharing charges with the second capacitor, in response to a second clock control signal.

2. The common mode feedback circuit of claim 1, wherein the first clock control signal and the second clock control signal have respective high periods that do not overlap in time.

3. The common mode feedback circuit of claim 1, wherein the first cell comprises:
a first switch supplying a bias voltage to a node to which an end of the third capacitor and an end of the fourth capacitor are connected, in response to the second clock control signal;
a second switch switching between the node and the common mode feedback terminal to which an end of the first capacitor is connected, in response to the first clock control signal;
a third switch switching between a common mode signal line and the other end of the fourth capacitor, in response to the second clock control signal;
a fourth switch switching between the other end of the third capacitor and the first output terminal, in response to the first clock control signal;
a fifth switch switching between the other end of the third capacitor and the common mode signal line, in response to the second clock control signal; and
a sixth switch switching between the other end of the fourth capacitor and the second output terminal, in response to the first clock control signal.

4. The common mode feedback circuit of claim 3, wherein the first cell further comprises a seventh capacitor connected between the other end of the third capacitor and the other end of the fourth capacitor.

5. The common mode feedback circuit of claim 1, wherein the second cell comprises:
a seventh switch switching between the common mode feedback terminal to which an end of the second capacitor is connected and a node to which an end of the fifth capacitor and an end of the sixth capacitor are connected, in response to the second clock control signal;
an eighth switch supplying a bias voltage to the node, in response to the first clock control signal;
a ninth switch switching between the other end of the sixth capacitor and the other end of the second capacitor to which the second output terminal is connected, in response to the second clock control signal;
a tenth switch switching between the common mode signal line and the other end of the fifth capacitor, in response to the first clock control signal;
an eleventh switch switching between the other end of the sixth capacitor and the common mode signal line, in response to the first clock control signal; and
a twelfth switch switching between the other end of the fifth capacitor and the first output terminal, in response to the second clock control signal.

6. The common mode feedback circuit of claim 5, wherein the second cell further comprises an eighth capacitor connected between the other end of the fifth capacitor and the other end of the sixth capacitor.

7. A programmable gain amplifier comprising:
a differential input unit;
a gain stage connected to the differential input unit; and
a common mode feedback circuit connected to the gain stage,
wherein the common mode feedback circuit comprises:
a first capacitor connected between a common mode feedback terminal and a first output terminal;
a second capacitor connected between the common mode feedback terminal and a second output terminal;
a first cell having a third capacitor sharing charges with the first capacitor and a fourth capacitor sharing charges with the second capacitor, in response to a first clock control signal; and
a second cell having a fifth capacitor sharing charges with the first capacitor and a sixth capacitor sharing charges with the second capacitor, in response to a second clock control signal.

8. The programmable gain amplifier of claim 7, wherein the first clock control signal and the second clock control signal have respective logic states that do not overlap in time and data are output in a first logic state of each of the first clock control signal and the second clock signal.

9. The programmable gain amplifier of claim 7, wherein the gain stage comprises a current mirror and a current source.

10. The programmable gain amplifier of claim 8, wherein the gain stage comprises a current mirror and a current source.

11. An image sensor comprising:
a pixel array arrayed in a predetermined color pattern;
a programmable gain amplifier having a differential input unit, a gain stage connected to the differential input unit, and a common mode feedback circuit connected to the gain stage; and
an analog-to-digital converter converting an amplified analog signal from the programmable gain amplifier to a digital signal,
wherein the common mode feedback circuit of the programmable gain amplifier comprises:
a first capacitor connected between a common mode feedback terminal and a first output terminal;
a second capacitor connected between the common mode feedback terminal and a second output terminal;
a first cell having a third capacitor sharing charges with the first capacitor and a fourth capacitor sharing charges with the second capacitor, in response to a first clock control signal; and
a second cell having a fifth capacitor sharing charges with the first capacitor and a sixth capacitor sharing charges with the second capacitor, in response to a second clock control signal.

12. The image sensor of claim 11, wherein the first clock control signal and the second clock control signal have respective logic states that do not overlap in time and data are output in a first logic state of each of the first clock control signal and the second clock signal.

* * * * *